(12) United States Patent
Li et al.

(10) Patent No.: US 11,800,663 B2
(45) Date of Patent: Oct. 24, 2023

(54) SLIDE RAIL MECHANISM, RETRACTABLE SCREEN STRUCTURE AND ELECTRONIC DEVICE

(71) Applicant: BEIJING XIAOMI MOBILE SOFTWARE CO., LTD., Beijing (CN)

(72) Inventors: Pengfei Li, Beijing (CN); Zhenhua Liu, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 8 days.

(21) Appl. No.: 17/557,377

(22) Filed: Dec. 21, 2021

(65) Prior Publication Data

US 2022/0418125 A1 Dec. 29, 2022

(30) Foreign Application Priority Data

Jun. 25, 2021 (CN) .......................... 202110711451.6

(51) Int. Cl.
| | |
|---|---|
| *H05K 5/02* | (2006.01) |
| *H05K 5/00* | (2006.01) |
| *G06F 1/16* | (2006.01) |

(52) U.S. Cl.
CPC ......... *H05K 5/0217* (2013.01); *G06F 1/1652* (2013.01); *H05K 5/0017* (2013.01)

(58) Field of Classification Search
CPC .... H05K 5/0217; G06F 1/1637; G06F 1/1652
See application file for complete search history.

(56) References Cited

U.S. PATENT DOCUMENTS

| | | | | |
|---|---|---|---|---|
| 6,085,388 | A * | 7/2000 | Kaneko | G06F 1/1681 |
| | | | | 16/338 |
| 9,844,251 | B2 * | 12/2017 | Lin | G06F 1/1652 |
| 10,747,269 | B1 * | 8/2020 | Choi | H04M 1/0237 |

(Continued)

FOREIGN PATENT DOCUMENTS

| | | |
|---|---|---|
| KR | 20160141255 A | 12/2016 |
| KR | 20170025520 A | 3/2017 |

(Continued)

OTHER PUBLICATIONS

Korean Patent Application No. 10-2021-0186280, Office Action dated Jan. 9, 2023, 8 pages.

(Continued)

*Primary Examiner* — Sagar Shrestha
(74) *Attorney, Agent, or Firm* — Cozen O'Connor

(57) ABSTRACT

A slide rail mechanism for a retractable screen structure includes: a holder assembly including a holder, the holder having a plurality of guide rails extending along a first direction; and a slide rail assembly including a sliding member coupled to a flexible display screen of the retractable screen structure, and an elastic assembly that includes at least one first elastic member having a first end coupled to the holder and a second end coupled to the sliding member, and at least one second elastic member fitted over at least one of the guide rails. The sliding member is arranged on the plurality of guide rails and slidable along the first direction, and the at least one first elastic member, the at least one second elastic member, and the flexible display screen are driven to move together when the sliding member slides along the guide rails.

18 Claims, 4 Drawing Sheets

(56) References Cited

U.S. PATENT DOCUMENTS

| | | |
|---|---|---|
| 10,972,592 B2 * | 4/2021 | Song .................... H04M 1/0237 |
| 10,976,775 B1 * | 4/2021 | Cha ........................ G06F 1/1622 |
| 2003/0119544 A1 | 6/2003 | Gventer |
| 2012/0002360 A1 * | 1/2012 | Seo ........................ G06F 1/1616 |
| | | 361/679.01 |
| 2014/0111954 A1 * | 4/2014 | Lee .................... H04M 1/0268 |
| | | 361/749 |
| 2019/0302841 A1 * | 10/2019 | Sun ........................ G06F 1/1637 |
| 2020/0264660 A1 * | 8/2020 | Song .................... H04M 1/0237 |
| 2020/0267246 A1 * | 8/2020 | Song .................... H04M 1/0268 |
| 2020/0267247 A1 * | 8/2020 | Song .................... H04M 1/0237 |
| 2021/0223820 A1 * | 7/2021 | Yoo ........................ G06F 1/1624 |
| 2022/0418123 A1 * | 12/2022 | Liu ........................ G01D 5/145 |

FOREIGN PATENT DOCUMENTS

| | | |
|---|---|---|
| KR | 20180038605 A | 4/2018 |
| KR | 20200013821 A | 2/2020 |

OTHER PUBLICATIONS

Korean Patent Application No. 10-2021-0186280, English translation of Office Action dated Jan. 9, 2023, 9 pages.

\* cited by examiner

SLIDE RAIL MECHANISM, RETRACTABLE SCREEN STRUCTURE AND ELECTRONIC DEVICE

CROSS-REFERENCE TO RELATED APPLICATIONS

This application claims benefit of and priority to Chinese Patent Application Serial No. 202110711451.6, filed on Jun. 25, 2021, the entire content of which is incorporated herein by reference.

BACKGROUND

With the continuous progress of screen technology, mass production of foldable flexible screens has been achieved, and flexible display screens that measure 0.01 mm in thickness are available globally, enriching the form of terminal products from smart wear to smart home, and smartphone terminals. Ultra-thin flexible screens allow diverse designs of products, such as foldable cell phones, ring-shaped cell phones, and special-shaped curved terminal products. Moreover, the arrival of 5G facilitates electrical connection of all intelligent products and accelerates data transmission, which enables certain modules of intelligent terminal products to function even when they are separated from the intelligent terminal products, such as camera modules and BOX acoustic modules. Development of battery technology has improved battery capacity, which leads to smaller terminal products and more flexible terminal product design.

With increased demand for flexible screen products, display areas need to be increased or decreased to enhance user experience when the device is used for different purposes, e.g., watching videos or making phone calls. There are currently two main screen expansion structures: foldable screen structures and retractable screen structures.

SUMMARY

The present disclosure relates to the field of retractable screen products and, more particularly, to a slide rail mechanism, a retractable screen structure, and an electronic device.

Embodiments of the present disclosure provide a slide rail mechanism for a retractable screen structure. The slide rail mechanism includes: a holder assembly including a holder, the holder having a plurality of guide rails extending along a first direction; and a slide rail assembly including a sliding member coupled to a flexible display screen of the retractable screen structure, and an elastic assembly that includes at least one first elastic member having a first end coupled to the holder and a second end coupled to the sliding member, and at least one second elastic member fitted over at least one of the guide rails. The sliding member is arranged on the plurality of guide rails and slidable along the first direction, and the at least one first elastic member, the at least one second elastic member, and the flexible display screen are driven to move together when the sliding member slides along the guide rails.

Embodiments of the present disclosure provide a retractable screen structure. The retractable screen structure includes: a slide rail mechanism and a flexible display screen. The slide rail mechanism includes: a holder assembly including a holder, the holder having a plurality of guide rails extending along a first direction; and a slide rail assembly including a sliding member coupled to a flexible display screen of the retractable screen structure, and an elastic assembly that includes at least one first elastic member having a first end coupled to the holder and a second end coupled to the sliding member, and at least one second elastic member fitted over at least one of the guide rails. The sliding member is arranged on the plurality of guide rails and slidable along the first direction, and the at least one first elastic member, the at least one second elastic member, and the flexible display screen are driven to move together when the sliding member slides along the guide rails. A rotation shaft assembly is arranged on a side of the holder away from the slide rail assembly, and an axial direction of the rotation shaft assembly is perpendicular to the first direction. The flexible display screen has a first end coupled to the sliding member and a second end wound around the rotation shaft assembly.

Embodiments of the present disclosure provide an electronic device. The electronic device includes: a housing including a first housing and a second housing arranged on the first housing and being slidable along a first direction, the first housing and the second housing forming a receiving structure having an opening; a retractable screen structure arranged within the receiving structure; and a drive assembly. The retractable screen structure includes: a slide rail mechanism and a flexible display screen. The slide rail mechanism includes: a holder assembly including a holder, the holder having a plurality of guide rails extending along a first direction; and a slide rail assembly including a sliding member coupled to a flexible display screen of the retractable screen structure, and an elastic assembly that includes at least one first elastic member having a first end coupled to the holder and a second end coupled to the sliding member, and at least one second elastic member fitted over at least one of the guide rails. The sliding member is arranged on the plurality of guide rails and slidable along the first direction, and the at least one first elastic member, the at least one second elastic member, and the flexible display screen are driven to move together when the sliding member slides along the guide rails. A rotation shaft assembly is arranged on a side of the holder away from the slide rail assembly, and an axial direction of the rotation shaft assembly is perpendicular to the first direction. The flexible display screen has a first end coupled to the sliding member and a second end wound around the rotation shaft assembly. The rotation shaft assembly is arranged on a side close to the second housing, and the flexible display screen has a first end close to a bottom of the housing and a second end coupled to the first housing to cover the opening. The drive assembly is arranged within the receiving structure and coupled to the slide rail mechanism, and the drive assembly drives the slide rail mechanism to move along the first direction, in which the drive assembly drives the slide rail mechanism to move along the first direction, brings the second housing, the slide rail assembly, the first end of the flexible display screen and the sliding member to move along the first direction relative to the first housing, and allows the flexible display screen to switch between a retracted state and an expanded state.

BRIEF DESCRIPTION OF DRAWINGS

The drawings herein are incorporated into the specification and constitute a part of the specification, show embodiments consistent with the present disclosure, and together with the specification are used to explain the principles of the present disclosure.

DETAILED DESCRIPTION OF EMBODIMENTS

Exemplary embodiments will be described in detail, with examples thereof illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with some aspects of the present disclosure as recited in the appended claims.

Terms used herein in the description of the present disclosure are only for the purpose of describing specific embodiments and are not intended to limit the present disclosure. Unless otherwise defined, technical terms or scientific terms used herein shall be understood in the ordinary sense as appreciated by those of ordinary skill in the art to which the present application belongs. Terms such as "first" and "second" used in the specification and claims are not intended to indicate any sequence, quantity or significance of indicated technical features, and are merely used to distinguish different elements. Likewise, the words "a," "an" and the like used in the specification and claims are not intended to limit the quantity but indicate the presence of at least one element or device referred to by the words. The term "a plurality of" or "several" means two or more than two. Terms such as "front," "rear," "lower" and/or "upper" are merely for the convenience of description and not limited to a position or an orientation, unless indicated otherwise. Terms "comprising" or "containing" mean that the elements or articles before these terms "comprising" or "containing" includes the elements or articles listed after the terms "comprising" or "containing" and do not exclude other elements or articles. The terms "connected" or "coupled" and the like are not limited to physical or mechanical connection, but may include electrical connection, regardless of direct connection or indirect connection.

Terms used in the present disclosure are only used for describing specific embodiments and not intended to limit the present disclosure. As used in the specification and claims, the terms, "a," "the" and "the" in singular forms, are intended to include plural forms, unless clearly indicated in the context otherwise. It should also be understood that, as used herein, the term "and/or" represents and contains any one and all possible combinations of one or more associated listed items.

The present disclosure provides a slide rail mechanism, a retractable screen structure, and an electronic device, all of which will be described in detail below in conjunction with the accompanying drawings, and features in the following embodiments and implementations may be combined with each other in the absence of conflict.

Figure 1:
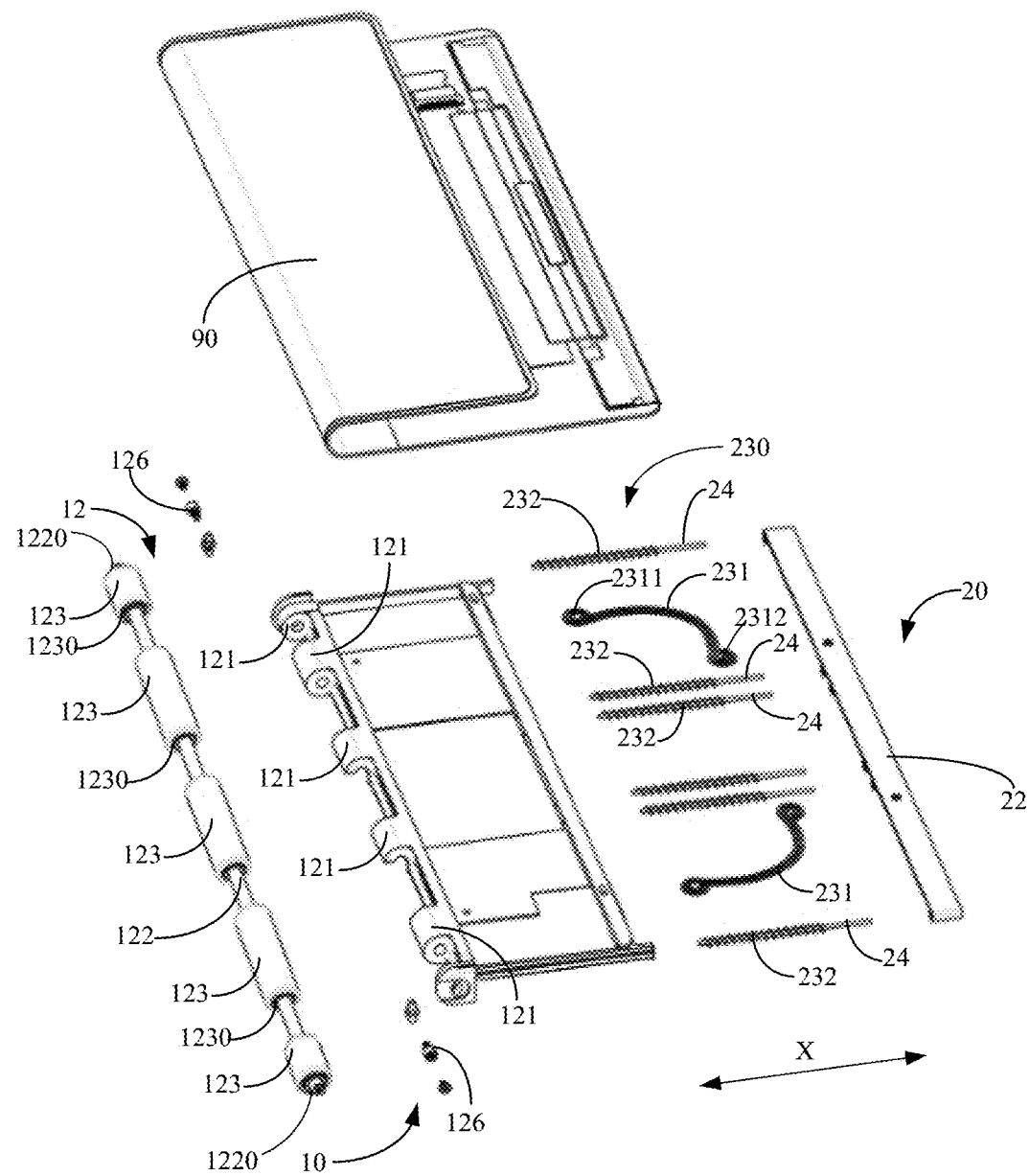
FIG. 1 is an exploded view of a retractable screen structure according to an exemplary embodiment of the present disclosure.
Figure 2:
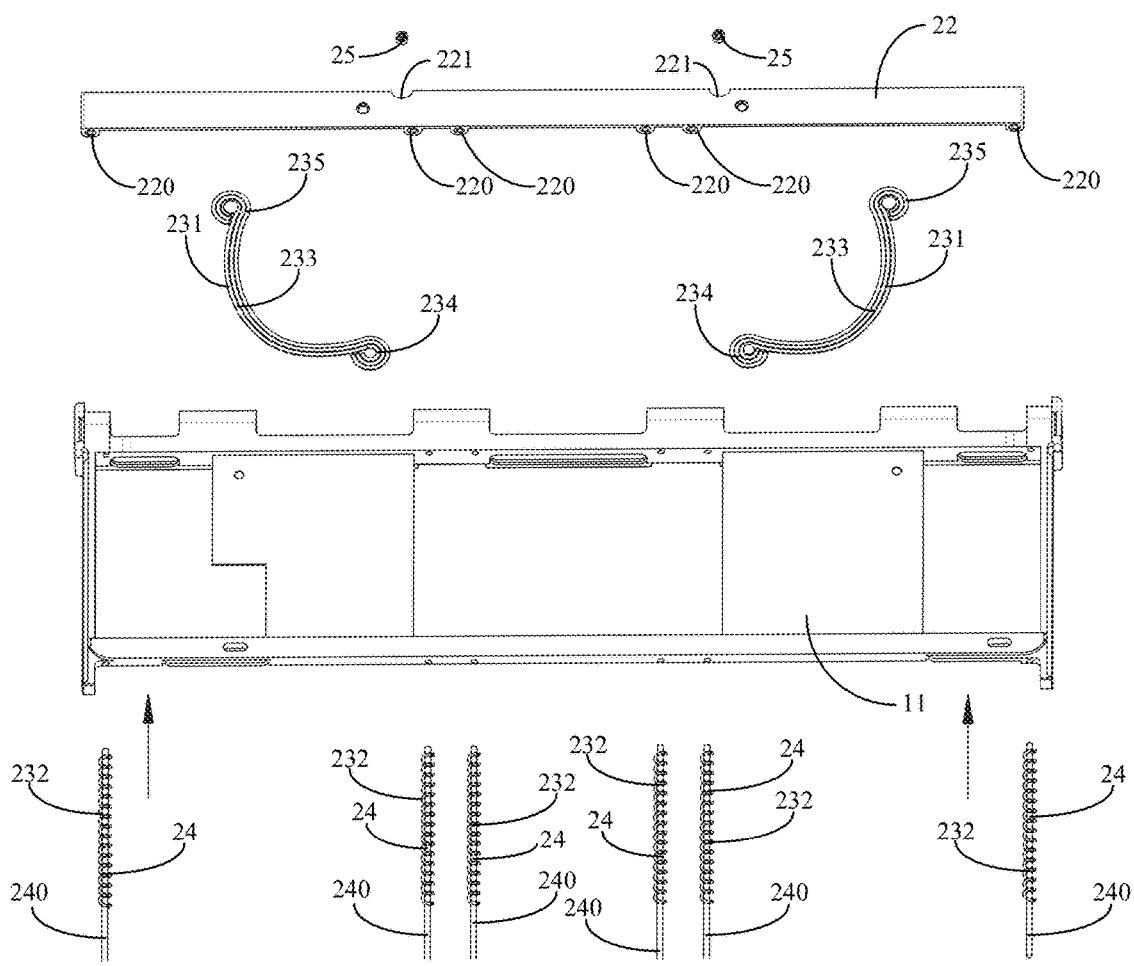
FIG. 2 is an exploded view of a slide rail mechanism according to an exemplary embodiment of the present disclosure.
Figure 3:
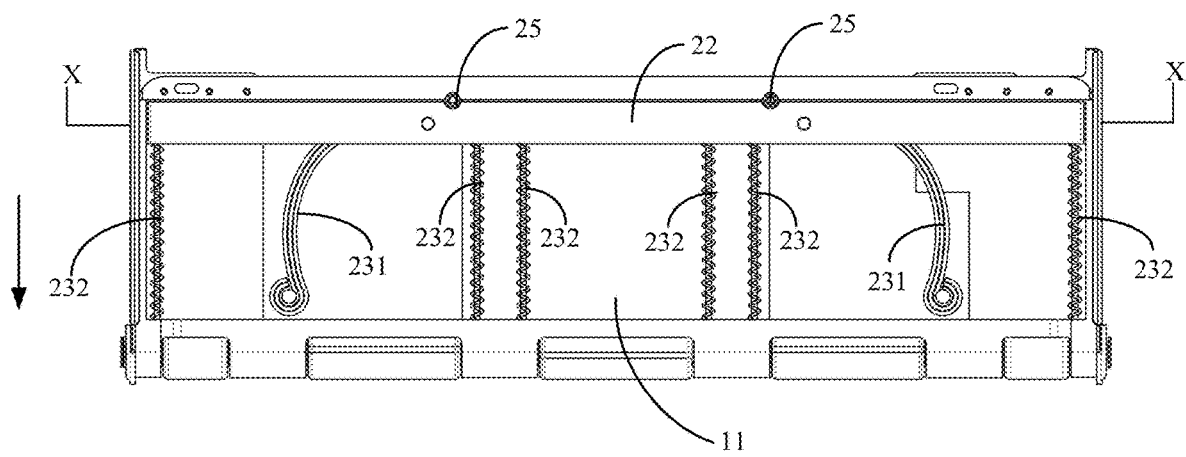
FIG. 3 is a schematic view of a slide rail mechanism according to an exemplary embodiment of the present disclosure.

Referring to FIGS. 1-3, embodiments of the present disclosure provide a slide rail mechanism for a retractable screen structure, including: a holder assembly 10 and a slide rail assembly 20. The holder assembly 10 includes a holder 11, and the holder 11 includes a plurality of guide rails 24 extending along a first direction X (a vertical direction shown in FIG. 3). The slide rail assembly 20 includes a sliding member 22 coupled to the flexible display screen 90 of the retractable screen structure, and an elastic assembly 230. The elastic assembly 230 includes at least one first elastic member 231 and at least one second elastic member 232; a first end 2311 of the first elastic member 231 is coupled to the holder 11, and a second end 2312 of the first elastic member 231 is coupled to the sliding member 22; the second elastic member 232 is fitted over at least one guide rail 24. The sliding member 22 is arranged on the plurality of guide rails 24 and slidable along the first direction X. When the sliding member 22 slides along the guide rails 24, the first elastic member 231, the second elastic member 232, and the flexible display screen 90 are driven to move together, and the elastic assembly 230 is stretched or compressed under the action of the sliding member 22 and thus is deformed, generating pre-tension on the flexible display screen 90. It can be understood that the sliding member 22 slides along the guide rails 24 in a direction denoted by an arrow in FIG. 3 relative to the holder 11, squeezing the first elastic member 231 and the second elastic member 232 of the elastic assembly 230, so that the elastic assembly 230 generates reversed tension on the flexible display screen and the flexible display screen keeps a flat state when expanding.

Through the above arrangement, with the slide rail mechanism of the present disclosure, the sliding member 22 moves along the guide rails 24 in the first direction X relative to the holder 11 and can drive the flexible display screen 90 of the retractable screen structure to move together, achieving expansion and retraction of the flexible display screen 90. The sliding member 22 drives the first elastic member 231 and the second elastic member 232 of the elastic assembly 230 to move together, stretching or squeezing the elastic assembly 230, which can produce pre-tension on the flexible display screen 90, and make the expansion of the flexible display screen 90 more smooth, to avoid causing problems such as screen bulging, swelling and distortion when the whole machine slides open.

Figure 4:
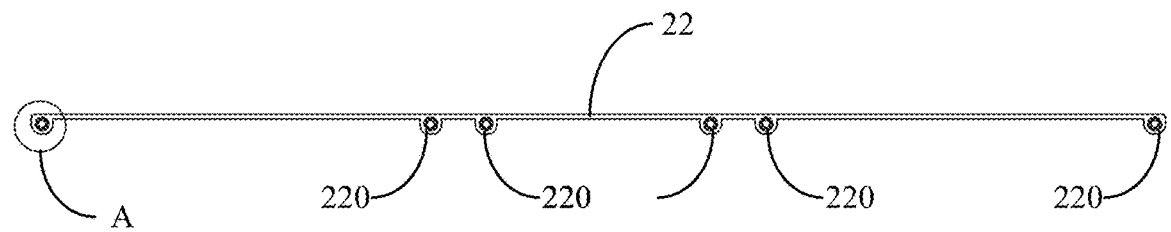
FIG. 4 a sectional view along X-X direction in FIG. 3.
Figure 5:
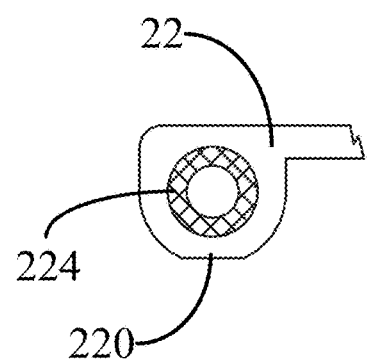
FIG. 5 is a partially enlarged view of part A in FIG. 4.

Referring to FIGS. 4 and 5, in some possible embodiments, the guide rail 24 includes a guide bar 240 extending along the first direction X, and the second elastic member 232 is fitted over the guide bar 240. The sliding member 22 includes a plurality of slide slots 220 corresponding to the number of the guide bars 240. The sliding member 22 is slidably arranged on the guide rails 24 through the slide slots 220, and when the sliding member 22 slides along the guide rails 24, the second elastic members 232 fitted over the guide bars 240 are driven to move and deform. It can be understood that due to the fit and cooperation between the slide slots 220 and the guide bars 240, a sliding direction of the sliding member 22 is limited to an extension direction of the guide rail 24, i.e., sliding along the first direction X, which can prevent the sliding member 22 from coming out of the guide rail 24. In some embodiments, the number of the guide rails 24 is an even number, and the guide rails are symmetrically arranged on the holder 11. The number of the second elastic members 232 corresponds to the number of the guide rails 24, each second elastic member 232 being fitted over one guide rail 24. In some embodiments, there are six groups of guide rails 24 symmetrically arranged on the holder 11, making the sliding member 22 more stable when sliding. In other examples, the number of the guide rails 24 may vary and will not be limited in the present disclosure.

In some possible embodiments, the slide rail assembly 20 further includes at least one limit block 25 arranged at an end (i.e., an upper end in FIG. 3) of the slide rail assembly 20 away from the holder 11, and the sliding member 22 includes a limit portion 221 that fits against the limit block 25. The limit block 25 fits against the limit portion 221 of the sliding member 22, which can limit a start position of the sliding member 22 and prevent the sliding member 22 from coming out of the guide rail 24. In some embodiments, the limit portion 221 may be understood as a groove, and there are two limit blocks 25 symmetrically arranged on the holder 11 and two limit portions 221 arranged in correspondence with the limit blocks 25, which will not be limited in the present disclosure. In an example shown in FIG. 3, the limit blocks 25 are arranged at the upper end of the holder 11, and the start position of the sliding member 22 is located at the upper end of the holder 11, in which state the elastic assembly 230 is preloaded and exerts elastic pre-tension on the sliding member 22 to keep the sliding member 22 in the start position.

In some possible embodiments, a plastic member 224 is fitted over the guide bar 240, and the slide slot 220 is fitted over the plastic member 224. The plastic member 224 reduces friction between the slide slot 220 and the guide rail 24, reducing wear to ensure smooth sliding. In some embodiments, the plastic member 224 may employ POM (polyoxymethylene resin) plastic that is a self-lubricating plastic. The slide slot 220 of the sliding member 22 and the plastic member 224 can be combined together as a single part by a co-molding process (insert-molding), to ensure that the sliding member 22 can only slide along the extension direction of the guide rail 24, i.e., the first direction X, to prevent the sliding member from falling off and improve structural stability.

In some possible embodiments, the first elastic member 231 includes an arc-shaped body portion 233, a first connection portion 234 coupled to a first end of the arc-shaped body portion 233, and a second connection portion 235 coupled to a second end of the arc-shaped body portion 233. The first connection portion 234 is coupled to the holder 11 and the second connection portion 235 is coupled to the sliding member 22. When the sliding member 22 slides along the guide rail 24, the second connection portion 235 is driven to move, deforming the first elastic member 231 and generating a reverse elastic force on the sliding member 22 and the flexible display screen, so that the flexible display screen remains flat when expanding. In some embodiments, the first elastic member 231 and the second elastic member 232 may be springs, tension springs and other springs made of metal materials, and exert pre-tension when assembled to keep the sliding member 22 in the start position. When the sliding member 22 slides along the guide rail 24 relative to the holder 11, the second connection portion 235 of the first elastic member 231 and the second elastic member 232 are driven to move, and the first elastic member 231 and the second elastic member 232 are deformed to generate the reverse elastic force on the sliding member 22. In some embodiments, the arc-shaped body portion 233 is C-shaped, and it can be understood that the first elastic member 231 may be a C-shaped spring. There are two first elastic members 231 symmetrically arranged between the holder 11 and the sliding member 22. There are a plurality of second elastic members 232, part of the second elastic members 232 being arranged between the two first elastic members 231 and another part of the second elastic members 232 being arranged outside the two first elastic members 231. By using the two kinds of elastic members in combination and spacing them apart, the overall elastic force of the elastic assembly 230 can be enhanced to provide a greater elastic force for the flexible display screen, thereby allowing the flexible display screen to have a longer expansion stroke. It is also possible to keep the elastic force substantially constant, and the tension on the flexible display screen is more stable.

The holder 11 may include a guide slot arranged along the first direction X and used for assembling the guide rail 24. During assembling, the second connection portion 235 of the first elastic member 231 and the sliding member 22 are first riveted together; the guide bar 240 of the guide rail 24 is inserted along a lower side surface of the holder 11 and into the guide slot; the slide slot 220 of the sliding member 22 and the second elastic member 232 are fitted over the guide bar 240 of the guide rail 24; a tail end of the guide bar 240 is firmly fixed to the holder 11 by spot welding after the guide bar 240 is completely mounted into the holder 11; the first connection portion 234 of the first elastic member 231 is fixed to the holder 11 by riveting. In such a way, the slide rail assembly 20 and the holder 11 are assembled together.

In some possible implementations, the holder 11 may be a stamped metal plate or adopt a hollowed-out design for weight reduction according to a space layout of the whole machine, which facilitates adjustment for locations with great influence on strength, increases space for a better utilization rate, and makes the whole machine thin and light. The flexible display screen 90 is fixed to the sliding member 22 of the slide rail assembly 20. The sliding member 22 may be made of SUS stainless steel plate and POM plastic by a co-molding process. The stainless steel plate can act as a main body to provide strength support. The slide slot may be formed by POM plastic injection molding and can slide relative to the guide rail 24 to reduce friction. The limit block 25 may be made of plastic, and can limit the start position of the sliding member 22 and prevent the sliding member 22 from coming out of the guide rail 24. The guide rail 24 may be formed by a stainless steel stamping process and fixed on the holder 11 by spot welding. In cooperation with the slide slot 220 on the sliding member 22, an inverted hook structure is formed to prevent the sliding member 22 from coming out of the guide rail 24 when sliding. An exposed surface of the sliding member 22 may act as an adhesive area 226, to which the flexible display screen 90 affixes. The guide bar 240 may be a cylindrical bar made of metal materials.

Referring to FIG. 1 again, embodiments of the present disclosure provide a retractable screen structure including the slide rail mechanism and the flexible display screen 90 as described in the above embodiments. A rotation shaft assembly 12 is arranged on a side of the holder 11 away from the slide rail assembly 20, and an axial direction of the rotation shaft assembly 12 is perpendicular to the first direction X. The flexible display screen 90 has a first end 901 coupled to the sliding member 22 and a second end 902 wound around the rotation shaft assembly 12.

Through the above arrangement, the sliding member 22 moves along the first direction X relative to the holder 11 and can drive the flexible display screen 90 to move together, to realize the expansion and retraction of the flexible display screen 90. The sliding member 22 drives the elastic assembly 230 to move together and stretches the elastic assembly 230, which can produce pre-tension on the flexible display screen 90 and make the flexible display screen 90 more flat during expansion, to avoid causing problems such as screen bulging, swelling and distortion when the whole machine slides open.

In some possible implementations, the rotation shaft assembly 12 includes a rotation shaft support 121, a rotation shaft 122 and a rotation wheel 123. The rotation shaft support 121 is arranged on the side of the holder 11 away from the slide rail assembly 20. The rotation shaft 122 passes through the rotation shaft support 121. The rotation wheel 123 is fitted over the rotation shaft 122, and the second end of the flexible display screen 90 is wound around the rotation wheel 123. When the flexible display screen 90 moves along with the slide rail assembly 22, the rotation wheel 123 passively rotates, making the expansion and retraction of the flexible display screen 90 more smooth.

In some embodiments, the flexible display screen 90 consists of a flexible OLED screen attached to an extremely thin layer of stainless steel mesh, which is highly flexible. There may be a plurality of rotation shaft supports 121 spaced apart from one another along a second direction perpendicular to the first direction X. There may be a plurality of rotation wheels 123, one rotation wheel being assembled between two adjacent rotation shaft supports 121. Depending on space between two adjacent rotation shaft supports 121, there may be large and small rotation wheels assembled in suitable positions. The rotation wheel 123 may be made of engineering plastic POM by injection molding, with a through hole in the middle and slots on both ends to receive bearings, and the rotation wheel 123 is fitted over the rotation shaft 122 and can passively rotate around the rotation shaft 122 via the bearings after being assembled. The rotation shaft 122 may adopt a D-shaped shaft, and the D-shaped cross section mainly serves to fix a bearing inner ring to prevent the bearing inner ring from rotating with the rotation shaft. The rotation shaft 122 may be made of stainless steel and passes through the plurality of rotation shaft supports 121. The rotation shaft 122 includes screw threads 1220 on both ends and can be fixed to a middle frame of the electronic device by a fastener such as a screw 126, to realize fixation of the rotation shaft. The screw 126 may be made of metals. The screw may include a child-mother screw with a screw rod on one end, passing through a screw washer to be fastened to the rotation shaft to lock the screw washer and the rotation shaft tightly. The bearing, which may be made of stainless steel or ceramic, is assembled on the rotation wheel 123, and each rotation wheel 123 is assembled with one bearing 1230 and a bearing spacer, separately on both ends of the rotation wheel. The bearing spacer may be made of metal materials. When the rotation wheels are mounted to the rotation shaft, one bearing spacer is arranged on each of both sides of each rotation wheel, and the rotation shaft 122 passes through an inner hole of the bearing spacer. When both ends of the rotation shaft 122 are locked by the screw 126, the screw washer serves to fix the bearing inner ring relative to the rotation shaft 122 and prevent the bearing inner ring from rotating along with a bearing outer ring, and has a function of grounding the bearing to the holder.

Figure 6:
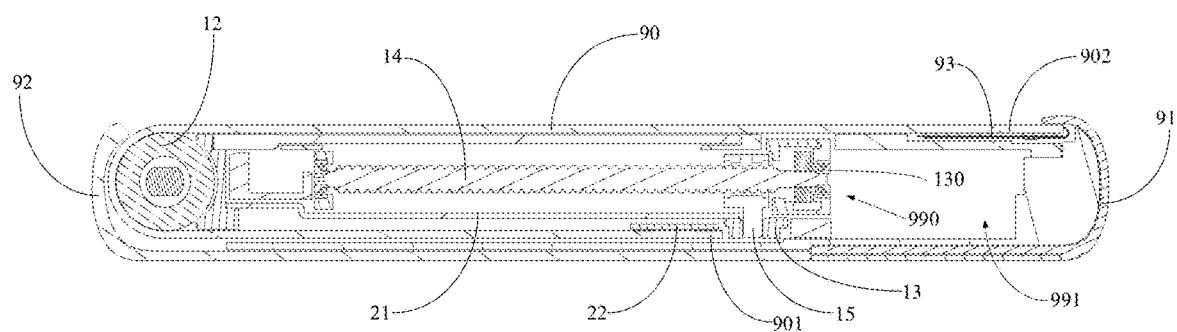
FIGS. 6-7 are schematic views of an electronic device with a flexible display screen in a retracted state and in an expanded state, respectively, according to an exemplary embodiment of the present disclosure.
Figure 7:
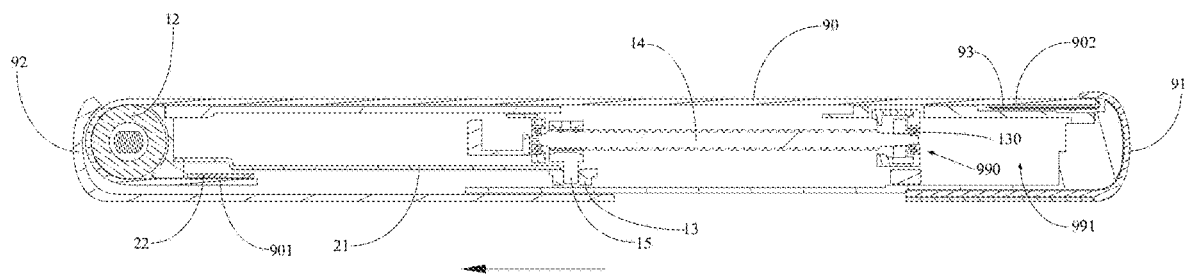
Figure 8:
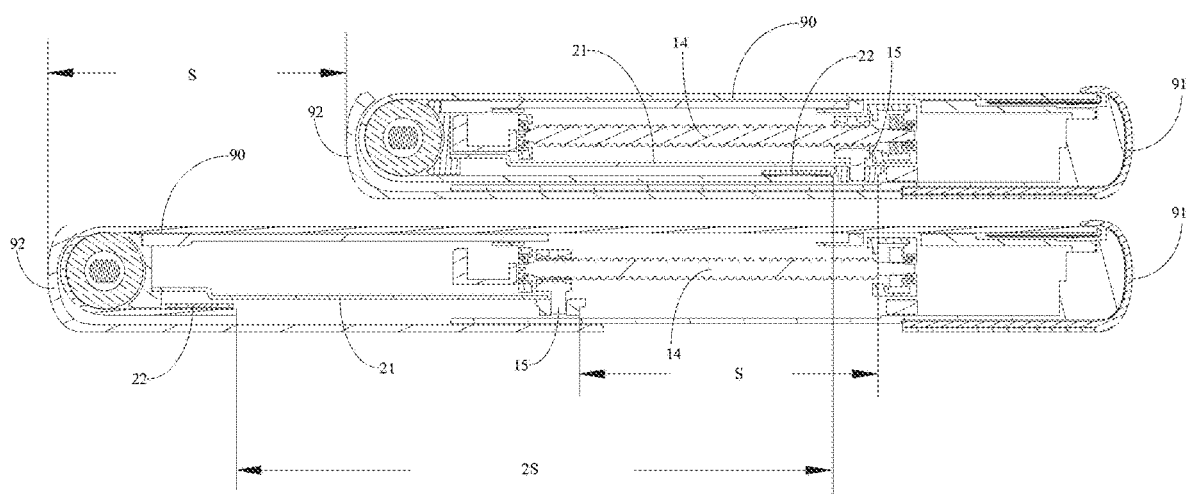
FIG. 8 is a comparison diagram illustrating an electronic device with a flexible display screen in a retracted state and in an expanded state, according to an exemplary embodiment of the present disclosure.

Referring to FIGS. 6 to 8, embodiments of the present disclosure provide an electronic device that may be a cell phone, a mobile terminal, a tablet computer, a laptop computer, a terminal handheld device with a screen, an in-vehicle display device, and the like. The electronic device includes a housing, the retractable screen structure as described in the above embodiments, and a drive assembly 990.

The housing includes a first housing 91 and a second housing 92 slidably arranged on the first housing 91 along the first direction X. The first housing 91 and the second housing 92 form a receiving structure 991 having an opening. The retractable screen structure is arranged within the receiving structure 991; the rotation shaft assembly 12 is arranged on a side close to the second housing 92; the first end 901 of the flexible display screen 90 is close to a bottom of the housing and the second end 902 of the flexible display screen 90 is coupled to the first housing 91 to cover the opening. The drive assembly 990 is arranged within the receiving structure 991, and the drive assembly 990 is coupled to the slide rail mechanism to drive the slide rail mechanism to move in the first direction X. In some embodiments, the first housing 91 may include a support plate 93, and the second end of the flexible display screen 90 is coupled to the support plate 93, which may provide support and protection for the flexible display screen 90.

The drive assembly 990 drives the slide rail mechanism to move along the first direction X, bringing the second housing 92, the slide rail assembly 20, the first end 901 of the flexible display screen 90 and the sliding member 22 to move along the first direction X relative to the first housing 91, and allowing the flexible display screen 90 to switch between a retracted state and an expanded state.

As shown in FIG. 6, the sliding member 22 in the start position is subjected to a preload force of the elastic assembly 230 due to the preload of two kinds of elastic members of the elastic assembly 230 and remains stationary in the start position due to the presence of the limit block 25, in which case the flexible display screen 90 is in the retracted state.

The drive assembly 990 as a power source is fixed to the middle frame (also known as the housing) of the whole machine, and the electronic device receives a command through UI and controls the drive assembly 990 to drive the slide rail mechanism to move in the first direction X (i.e., moving leftwards in FIG. 7), so that the slide rail mechanism as a whole slides out relative to the first housing 91 in a direction away from the first housing 91. During this process, the first end of the flexible display screen 90 slides together with the sliding member 22, and the rotation wheel of the rotation shaft assembly passively rotates under the force of the flexible display screen 90. Since the second end of the flexible display screen 90 is coupled to the first housing 91, an effect of expanding the flexible display screen 90 gradually can be achieved as the slide rail mechanism gradually slides out, as shown in FIG. 7. During the sliding process of the slide rail mechanism, the sliding member 22 can move from one end of the holder 11 to the other end of the holder under the pull of the flexible display screen, which can further increase an expanding length of the flexible display screen 90. Moreover, during the sliding process, the elastic assembly 230 is stretched by the sliding member 22 and exerts, on the sliding member 22, elastic tension with a reverse direction opposite to a sliding direction, the flexible display screen 90 is always subject to the tension in the reverse direction, which is equivalent to pulling the flexible display screen 90 rightwards. As a result, the flexible display screen 90 expanded is more flat, and a trajectory of bending the flexible display screen 90 conforms to the design intention, to avoid causing problems such as screen bulging, swelling and distortion when the whole machine slides open.

It can be understood that throughout the process, the sliding member 22 is pulled by the second end of the flexible display screen 90 and can move from one end of the holder 11 to the other end thereof. Assuming that the slide rail mechanism slides out for a stroke of S relative to the first housing 91 and the sliding member 22 slides for a stroke of S, the first end of the flexible display screen 90 moves for a distance of 2S along with the slide rail mechanism relative to the first housing 91.

When the whole machine receives an external command for retraction, a drive motor 130 starts to drive reversely, retracting the slide rail mechanism and the flexible display screen 90. In this process, the holder 11 and the fixed seat are driven by the drive assembly 990 to move in the reverse direction, the flexible display screen 90 and the sliding member 22 are gradually retracted under the elastic force of the elastic assembly 230, and the sliding member 22 returns to the start position under the elastic force of the elastic assembly 230, thus restoring the flexible display screen 90 to the retracted state. Therefore, the use of the slide rail mechanism of the present disclosure can smoothly and effectively ensure that the flexible display screen keeps a bending form throughout the sliding opening and retracting process, and that the power loss caused by the friction generated in the process of sliding opening and retracting the screen is at a low level, and realize practical and easily attainable solutions to guarantee product reliability.

Referring to FIGS. 6 and 7, in some possible embodiments, the holder 11 includes a transmission member 13. The drive assembly 990 includes the drive motor 130, a screw rod 14 coupled to the drive motor 130, and a nut 15 fitted over the screw rod 14. The screw rod 14 extends along the first direction X, and the nut 15 abuts against the transmission member 13. The drive motor 130 drives the screw rod 14 to rotate, bringing the nut 15 and the transmission member 13 to move along the first direction X, and bringing the slide rail mechanism to move along the first direction X. It should be noted that the drive assembly 990 may also adopt a rack-and-pinion structure, a worm-and-gear structure and the like.

Other embodiments of the present disclosure may be conceivable for those skilled in the art after considering the specification and practicing the technical solutions disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are regarded as exemplary only, and the true scope of the present disclosure are indicated by the following claims.

It should be understood that the present disclosure is not limited to the particular structures described above and shown in the drawings, and various modifications and changes can be made without departing from the scope of the present disclosure. The scope of the present disclosure is only limited by the appended claims.

What is claimed is:

1. A slide rail mechanism for a retractable screen structure, comprising:
a holder assembly, the holder assembly comprising a holder, the holder having a plurality of guide rails extending along a first direction, and each of the plurality of guide rails comprising a guide bar; and
a slide rail assembly, the slide rail assembly comprising:
a sliding member coupled to a flexible display screen of the retractable screen structure and comprising a plurality of slide slots, wherein the number of slide slots corresponds to the number of guide bars, and the slide slots are fitted over the guide bars; and
an elastic assembly, the elastic assembly comprising: at least one first elastic member and at least one second elastic member, the at least one first elastic member having a first end coupled to the holder and a second end coupled to the sliding member, and the at least one second elastic member being fitted over the guide bar,
wherein the sliding member is arranged on the plurality of guide rails through the slide slots and slidable along the first direction, and the at least one first elastic member, the at least one second elastic member, and the flexible display screen are driven to move together when the sliding member slides along the guide rails, and
wherein a plastic member is fitted over each of the guide bars, and each of the slide slots is fitted over the plastic member.

2. The slide rail mechanism according to claim 1, wherein the slide rail assembly further comprises at least one limit block arranged on the holder, and the sliding member comprises a limit portion fitting against the limit block.

3. The slide rail mechanism according to claim 1, wherein:
the number of the guide rails is an even number, and the guide rails are symmetrically arranged on the holder;
the number of the at least one second elastic member corresponds to the number of the guide rails, each second elastic member being fitted over one guide rail.

4. The slide rail mechanism according to claim 1, wherein:
the at least one first elastic member comprises an arc-shaped body portion, a first connection portion coupled to a first end of the arc-shaped body portion, and a second connection portion coupled to a second end of the arc-shaped body portion, the first connection portion being coupled to the holder and the second connection portion being coupled to the sliding member;
and wherein sliding of the sliding member along the guide rails causes the second connection portion to move which in turn causes the first elastic member to deform.

5. The slide rail mechanism according to claim 4, wherein the arc-shaped body portion is C-shaped.

6. The slide rail mechanism according to claim 1, wherein two first elastic members are symmetrically arranged between the holder and the sliding member.

7. The slide rail mechanism according to claim 6, wherein a plurality of second elastic members are arranged, some of the plurality of second elastic members being arranged between the two first elastic members and some other of the plurality of second elastic members being arranged outside the two first elastic members.

8. The slide rail mechanism according to claim 2, wherein:
the at least one limit block is a groove; and
the number of the limit blocks corresponds to the number of limit portions.

9. The slide rail mechanism according to claim 1, wherein the holder is hollowed.

10. A retractable screen structure, comprising:
a slide rail mechanism comprising:
a holder assembly comprising a holder, the holder having a plurality of guide rails extending along a first direction; and a slide rail assembly comprising:
- a sliding member coupled to a flexible display screen of the retractable screen structure; and
- an elastic assembly comprising: at least one first elastic member having a first end coupled to the holder and a second end coupled to the sliding member, and at least one second elastic member fitted over at least one of the guide rails, wherein the sliding member is arranged on the plurality of guide rails and slidable along the first direction, and the at least one first elastic member, the at least one second elastic member, and the flexible display screen are driven to move together when the sliding member slides along the guide rails, wherein a rotation shaft assembly is arranged on a side of the holder away from the slide rail assembly, and an axial direction of the rotation shaft assembly is perpendicular to the first direction; and a flexible display screen having a first end coupled to the sliding member and a second end wound around the rotation shaft assembly.

11. The retractable screen structure according to claim 10, wherein the rotation shaft assembly comprises:
- a rotation shaft support arranged on the side of the holder away from the slide rail assembly;
- a rotation shaft passing through the rotation shaft support; and
- a rotation wheel fitted over the rotation shaft, the second end of the flexible display screen being wound around the rotation wheel.

12. The retractable screen structure according to claim 11, wherein a plurality of rotation shaft supports are spaced apart along a second direction perpendicular to the first direction.

13. The retractable screen structure according to claim 12, wherein a plurality of rotation wheels are arranged, one rotation wheel being assembled between two adjacent rotation shaft supports.

14. The retractable screen structure according to claim 13, wherein the plurality of rotation wheels comprise large rotation wheels and small rotation wheels.

15. The retractable screen structure according to claim 11, wherein the rotation shaft is a D-shaped shaft.

16. An electronic device, comprising:
- a housing comprising a first housing and a second housing arranged on the first housing and being slidable along a first direction, the first housing and the second housing forming a receiving structure having an opening;
- a retractable screen structure arranged within the receiving structure, wherein the retractable screen structure comprises:
a slide rail mechanism comprising:
- a holder assembly comprising a holder, the holder having a plurality of guide rails extending along a first direction; and
- a slide rail assembly comprising:
  - a sliding member coupled to a flexible display screen of the retractable screen structure; and
  - an elastic assembly comprising: at least one first elastic member having a first end coupled to the holder and a second end coupled to the sliding member, and at least one second elastic member fitted over at least one of the guide rails, wherein the sliding member is arranged on the plurality of guide rails and slidable along the first direction, and the at least one first elastic member, the at least one second elastic member, and the flexible display screen are driven to move together when the sliding member slides along the guide rails, wherein a rotation shaft assembly is arranged on a side of the holder away from the slide rail assembly, and an axial direction of the rotation shaft assembly being perpendicular to the first direction; and a flexible display screen having a first end coupled to the sliding member and a second end wound around the rotation shaft assembly, wherein the rotation shaft assembly is arranged on a side close to the second housing, and the first end of the flexible display screen is close to a bottom of the housing and the second end of the flexible display screen is coupled to the first housing to cover the opening; and a drive assembly arranged within the receiving structure and coupled to the slide rail mechanism, the drive assembly driving the slide rail mechanism to move along the first direction, wherein the drive assembly drives the slide rail mechanism to move along the first direction, brings the second housing, the slide rail assembly, the first end of the flexible display screen and the sliding member to move along the first direction relative to the first housing, and allows the flexible display screen to switch between a retracted state and an expanded state.

17. The electronic device according to claim 16, wherein:
the drive assembly comprises a drive motor, a screw rod coupled to the drive motor, and a nut fitted over the screw rod, the screw rod extending along the first direction and the nut abutting against the holder;
the drive motor drives the screw rod to rotate, and brings the nut and the holder to move along the first direction and brings the slide rail mechanism to move along the first direction.

18. The electronic device according to claim 16, wherein:
the rotation shaft assembly comprises a rotation shaft; and
the rotation shaft comprises screw threads on both ends and is fixed to the electronic device by fasteners.

* * * * *